(12) United States Patent
Poynot

(10) Patent No.: US 9,184,109 B2
(45) Date of Patent: Nov. 10, 2015

(54) SYNTHETIC JET ACTUATOR EQUIPPED WITH ENTRAINMENT FEATURES

(71) Applicant: NUVENTIX, INC., Austin, TX (US)

(72) Inventor: Andrew Poynot, Austin, TX (US)

(73) Assignee: Nuventix, Inc., Austin, TX (US)

( * ) Notice: Subject to any disclaimer, the term of this patent is extended or adjusted under 35 U.S.C. 154(b) by 125 days.

(21) Appl. No.: 14/195,162

(22) Filed: Mar. 3, 2014

(65) Prior Publication Data

US 2014/0254093 A1   Sep. 11, 2014

Related U.S. Application Data

(60) Provisional application No. 61/771,271, filed on Mar. 1, 2013.

(51) Int. Cl.
*H01L 23/46* (2006.01)
*H05K 7/20* (2006.01)
(Continued)

(52) U.S. Cl.
CPC .............. *H01L 23/467* (2013.01); *H01L 23/46* (2013.01); *H05B 33/08* (2013.01); *H05K 7/20* (2013.01); *H05K 7/20172* (2013.01); *H01L 2924/0002* (2013.01)

(58) Field of Classification Search
CPC ... H01L 23/46; H01L 23/467; H01L 23/4735; H05K 7/20; H05K 7/20172; G06F 1/20; F21V 29/00; F21V 29/02; F21V 29/83; H05B 33/08; F04B 45/047; F04B 43/046
USPC .............. 361/679.46–679.5, 689, 690–697, 361/704–715; 165/80.2, 80.3, 104.21, 165/109.1, 120, 121, 104.33, 104.34, 185; 239/4, 8, 11, 102.1, 102.2; 362/34, 84, 362/311.02, 234, 235, 294, 373, 307
See application file for complete search history.

(56) References Cited

U.S. PATENT DOCUMENTS 5,758,823 A   6/1998   Glezer et al.
5,894,990 A   4/1999   Glezer et al.
(Continued)

*Primary Examiner* — Michail V Datskovskiy
(74) *Attorney, Agent, or Firm* — Wolf, Greenfield & Sacks, P.C.

(57) ABSTRACT

A thermal management system (201) is provided which includes a housing (203) equipped with a first set of apertures $S_1=\{a_1, a_i\}$ (213), a second set of apertures $S_2=\{b_1, \ldots b_j\}$ (215) and a set of entrainment features $S_3=\{c_1, C_k\}$ (217), wherein i, j, k≥1, and wherein, for any pair of adjacent apertures $P_a=\{a_m, b_n\}$, wherein $a_m \in S_1$ and $m \in I=\{1, \ldots, i\}$, and wherein $b_n \in S_2$ and $n \in J=\{1, \ldots, j\}$, there is at least one entrainment feature $c_p \in S_3$ which is disposed between aperture $a_m$ and aperture $b_n$, wherein $p \in K=\{1, \ldots, k\}$. The thermal management system also includes a synthetic jet actuator disposed in said housing which is in fluidic communication with the sets of apertures $S_1$ and $S_2$ and which operates to create a synthetic jet at each aperture $d_r \in \{S_1, S_2\}$, wherein $r \in I \cup J$.

20 Claims, 8 Drawing Sheets

(51) Int. Cl.
*H01L 23/467* (2006.01)
*H05B 33/08* (2006.01)
*G06F 1/20* (2006.01)

(56) References Cited

U.S. PATENT DOCUMENTS

| | | | |
|---|---|---|---|
| 5,988,522 A | 11/1999 | Glezer et al. | |
| 6,056,204 A | 5/2000 | Glezer et al. | |
| 6,123,145 A | 9/2000 | Glezer et al. | |
| 6,247,525 B1 | 6/2001 | Smith et al. | |
| 6,588,497 B1 | 7/2003 | Glezer et al. | |
| 7,252,140 B2 | 8/2007 | Glezer et al. | |
| 7,336,486 B2 * | 2/2008 | Mongia | F04B 43/046 165/104.33 |
| 7,606,029 B2 | 10/2009 | Mahalingam et al. | |
| 7,607,470 B2 | 10/2009 | Glezer et al. | |
| 7,760,499 B1 | 7/2010 | Darbin et al. | |
| 7,768,779 B2 | 8/2010 | Heffington et al. | |
| 7,784,972 B2 | 8/2010 | Heffington et al. | |
| 7,819,556 B2 | 10/2010 | Heffington et al. | |
| 7,932,535 B2 | 4/2011 | Mahalingam et al. | |
| 8,030,886 B2 | 10/2011 | Mahalingam et al. | |
| 8,035,966 B2 | 10/2011 | Reichenbach et al. | |
| 8,051,905 B2 * | 11/2011 | Arik | H01L 23/4735 165/104.33 |
| 8,066,410 B2 | 11/2011 | Booth et al. | |
| 8,069,910 B2 | 12/2011 | Beltran et al. | |
| 8,136,576 B2 | 3/2012 | Grimm | |
| 8,240,885 B2 * | 8/2012 | Miller | F21S 8/038 362/294 |
| 8,290,724 B2 | 10/2012 | Darbin et al. | |
| 8,299,691 B2 | 10/2012 | Grimm | |
| 8,388,142 B2 | 3/2013 | Jones et al. | |
| 8,430,644 B2 | 4/2013 | Mahalingam et al. | |
| 8,453,715 B2 * | 6/2013 | Arik | H01L 23/467 165/125 |
| 8,967,832 B2 * | 3/2015 | Zakula | F21V 33/0088 362/249.02 |
| 2007/0023169 A1 | 2/2007 | Mahalingam et al. | |
| 2007/0081027 A1 | 4/2007 | Beltran et al. | |
| 2007/0096118 A1 | 5/2007 | Mahalingam et al. | |
| 2007/0119573 A1 | 5/2007 | Mahalingam et al. | |
| 2007/0119575 A1 | 5/2007 | Glezer et al. | |
| 2007/0127210 A1 | 6/2007 | Mahalingam et al. | |
| 2007/0141453 A1 | 6/2007 | Mahalingam et al. | |
| 2007/0272393 A1 | 11/2007 | Reichenbach et al. | |
| 2008/0006393 A1 | 1/2008 | Grimm | |
| 2008/0009187 A1 | 1/2008 | Grimm et al. | |
| 2008/0043061 A1 | 2/2008 | Glezer et al. | |
| 2008/0151541 A1 | 6/2008 | Heffington et al. | |
| 2008/0219007 A1 | 9/2008 | Heffington et al. | |
| 2008/0295997 A1 | 12/2008 | Heffington et al. | |
| 2009/0084866 A1 | 4/2009 | Grimm et al. | |
| 2009/0109625 A1 | 4/2009 | Booth et al. | |
| 2009/0141065 A1 | 6/2009 | Darbin et al. | |
| 2010/0033071 A1 | 2/2010 | Heffington et al. | |
| 2010/0039012 A1 | 2/2010 | Grimm | |
| 2010/0110635 A1 | 5/2010 | Jones et al. | |
| 2010/0263838 A1 | 10/2010 | Mahalingam et al. | |
| 2011/0026218 A1 | 2/2011 | Mahalingam et al. | |
| 2011/0050100 A1 * | 3/2011 | Bailey | F21K 9/13 315/35 |
| 2011/0089804 A1 | 4/2011 | Mahalingam et al. | |
| 2011/0198056 A1 | 8/2011 | Grimm et al. | |
| 2012/0111969 A1 | 5/2012 | Mahalingam et al. | |
| 2012/0145361 A1 | 6/2012 | Glezer et al. | |
| 2012/0199667 A1 | 8/2012 | Darbin et al. | |
| 2012/0287637 A1 | 11/2012 | Mahalingam et al. | |
| 2012/0292401 A1 | 11/2012 | Mahalingam et al. | |
| 2012/0298769 A1 | 11/2012 | Heffington et al. | |
| 2013/0083520 A1 | 4/2013 | Booth et al. | |
| 2013/0133865 A1 | 5/2013 | Mahalingam et al. | |
| 2013/0155680 A1 | 6/2013 | Grimm et al. | |
| 2013/0162958 A1 | 6/2013 | Jones et al. | |
| 2013/0188307 A1 | 7/2013 | Mahalingam et al. | |
| 2013/0239589 A1 | 9/2013 | Mahalingam et al. | |
| 2013/0243030 A1 | 9/2013 | Mahalingam et al. | |
| 2013/0323099 A1 * | 12/2013 | Li | F04B 45/047 417/413.1 |

* cited by examiner

- Prior Art -

US 9,184,109 B2

SYNTHETIC JET ACTUATOR EQUIPPED WITH ENTRAINMENT FEATURES

CROSS-REFERENCE TO RELATED APPLICATION

This application claims the benefit of priority from U.S. provisional application No. 61/771,271, filed Mar. 1, 2013, having the same title, and the same inventor, and which is incorporated herein by reference in its entirety.

FIELD OF THE DISCLOSURE

The present disclosure relates generally to synthetic jet ejectors, and more particularly to synthetic jet ejectors equipped with entrainment features.

BACKGROUND OF THE DISCLOSURE

A variety of thermal management devices are known to the art, including conventional fan based systems, piezoelectric systems, and synthetic jet ejectors. The latter type of system has emerged as a highly efficient and versatile thermal management solution, especially in applications where thermal management is required at the local level.

Various examples of synthetic jet ejectors are known to the art. Earlier examples are described in U.S. Pat. No. 5,758,823 (Glezer et al.), entitled "Synthetic Jet Actuator and Applications Thereof"; U.S. Pat. No. 5,894,990 (Glezer et al.), entitled "Synthetic Jet Actuator and Applications Thereof"; U.S. Pat. No. 5,988,522 (Glezer et al.), entitled Synthetic Jet Actuators for Modifying the Direction of Fluid Flows"; U.S. Pat. No. 6,056,204 (Glezer et al.), entitled "Synthetic Jet Actuators for Mixing Applications"; U.S. Pat. No. 6,123,145 (Glezer et al.), entitled Synthetic Jet Actuators for Cooling Heated Bodies and Environments"; and U.S. Pat. No. 6,588,497 (Glezer et al.), entitled "System and Method for Thermal Management by Synthetic Jet Ejector Channel Cooling Techniques".

Further advances have been made in the art of synthetic jet ejectors, both with respect to synthetic jet ejector technology in general and with respect to the applications of this technology. Some examples of these advances are described in U.S. 20100263838 (Mahalingam et al.), entitled "Synthetic Jet Ejector for Augmentation of Pumped Liquid Loop Cooling and Enhancement of Pool and Flow Boiling"; U.S. 20100039012 (Grimm), entitled "Advanced Synjet Cooler Design For LED Light Modules"; U.S. 20100033071 (Heffington et al.), entitled "Thermal management of LED Illumination Devices"; U.S. 20090141065 (Darbin et al.), entitled "Method and Apparatus for Controlling Diaphragm Displacement in Synthetic Jet Actuators"; U.S. 20090109625 (Booth et al.), entitled Light Fixture with Multiple LEDs and Synthetic Jet Thermal Management System"; U.S. 20090084866 (Grimm et al.), entitled Vibration Balanced Synthetic Jet Ejector"; U.S. 20080295997 (Heffington et al.), entitled Synthetic Jet Ejector with Viewing Window and Temporal Aliasing"; U.S. 20080219007 (Heffington et al.), entitled "Thermal Management System for LED Array"; U.S. 20080151541 (Heffington et al.), entitled "Thermal Management System for LED Array"; U.S. 20080043061 (Glezer et al.), entitled "Methods for Reducing the Non-Linear Behavior of Actuators Used for Synthetic Jets"; U.S. 20080009187 (Grimm et al.), entitled "Moldable Housing design for Synthetic Jet Ejector"; U.S. 20080006393 (Grimm), entitled Vibration Isolation System for Synthetic Jet Devices"; U.S. 20070272393 (Reichenbach), entitled "Electronics Package for Synthetic Jet Ejectors"; U.S. 20070141453 (Mahalingam et al.), entitled "Thermal Management of Batteries using Synthetic Jets"; U.S. 20070096118 (Mahalingam et al.), entitled "Synthetic Jet Cooling System for LED Module"; U.S. 20070081027 (Beltran et al.), entitled "Acoustic Resonator for Synthetic Jet Generation for Thermal Management"; U.S. 20070023169 (Mahalingam et al.), entitled "Synthetic Jet Ejector for Augmentation of Pumped Liquid Loop Cooling and Enhancement of Pool and Flow Boiling"; U.S. 20070119573 (Mahalingam et al.), entitled "Synthetic Jet Ejector for the Thermal Management of PCI Cards"; U.S. 20070119575 (Glezer et al.), entitled "Synthetic Jet Heat Pipe Thermal Management System"; U.S. 20070127210 (Mahalingam et al.), entitled "Thermal Management System for Distributed Heat Sources"; U.S. 20070141453 (Mahalingam et al.), entitled "Thermal Management of Batteries using Synthetic Jets"; U.S. Pat. No. 7,252,140 (Glezer et al.), entitled "Apparatus and Method for Enhanced Heat Transfer"; U.S. Pat. No. 7,606,029 (Mahalingam et al.), entitled "Thermal Management System for Distributed Heat Sources"; U.S. Pat. No. 7,607,470 (Glezer et al.), entitled "Synthetic Jet Heat Pipe Thermal Management System"; U.S. Pat. No. 7,760,499 (Darbin et al.), entitled "Thermal Management System for Card Cages"; U.S. Pat. No. 7,768,779 (Heffington et al.), entitled "Synthetic Jet Ejector with Viewing Window and Temporal Aliasing"; U.S. Pat. No. 7,784,972 (Heffington et al.), entitled "Thermal Management System for LED Array"; and U.S. Pat. No. 7,819,556 (Heffington et al.), entitled "Thermal Management System for LED Array".

SUMMARY OF THE DISCLOSURE

In one aspect, a thermal management system is provided which comprises (a) a housing equipped with a first set of apertures $S_1 = \{a_1, \ldots, a_i\}$, a second set of apertures $S_2 = \{b_1, \ldots, b_j\}$ and a set of entrainment features $S_3 = \{c_1, \ldots, c_k\}$, wherein i, j, k≥1, and wherein, for any pair of adjacent apertures $P_a = \{a_m, b_n\}$, wherein $a_m \in S_1$ and $m \in I = \{1, \ldots, i\}$, and wherein $b_n \in S_2$ and $n \in J = \{1, \ldots, j\}$, there is at least one entrainment feature $c_p \in S_3$ which is disposed between aperture $a_m$ and aperture $b_n$, wherein $p \in K = \{1, \ldots, k\}$; (b) a synthetic jet actuator disposed in said housing which is in fluidic communication with the sets of apertures $S_1$ and $S_2$ and which operates to create a synthetic jet at each aperture $d_r \in \{S_1, S_2\}$, wherein $r \in I \cup J$. The thermal management system may further comprise (c) a heat sink equipped with a plurality of fins and positioned with respect to said actuator such that the synthetic jet created at each aperture $d_r$ is directed between an adjacent pair of said fins.

In another aspect, a method is provided for cooling a heat source. The method includes providing a thermal management system comprising (a) a housing equipped with a first set of apertures $S_1=\{a_1, \ldots, a_i\}$, a second set of apertures $S_2=\{b_1, k\}$ and a set of entrainment features $S_3=\{c_1, \ldots, c_k\}$, wherein i, j, k≥1, and wherein, for any pair of adjacent apertures $P_a=\{a_m, b_n\}$, wherein $a_m \in S_1$ and m ∈ I=$\{1, \ldots, i\}$, and wherein $b_n \in S_2$ and n ∈ J=$\{1, \ldots, j\}$, there is at least one entrainment feature $c_p \in S_3$ which is disposed between aperture $a_m$ and aperture $b_n$, wherein p ∈ K=$\{1, \ldots, k\}$, and (b) a synthetic jet actuator disposed in said housing which is in fluidic communication with the sets of apertures $S_1$ and $S_2$ and which operates to create a synthetic jet at each aperture $d_r$ ∈ $\{S_1, S_2\}$, wherein r ∈ I∪J. the method further includes disposing a heat source on a surface of said housing, and operating said synthetic jet actuator so as to create a synthetic jet at each aperture $d_r$ 8 $\{S_1, S_2\}$, wherein r ∈ I∪J.

DETAILED DESCRIPTION

Figure 1:
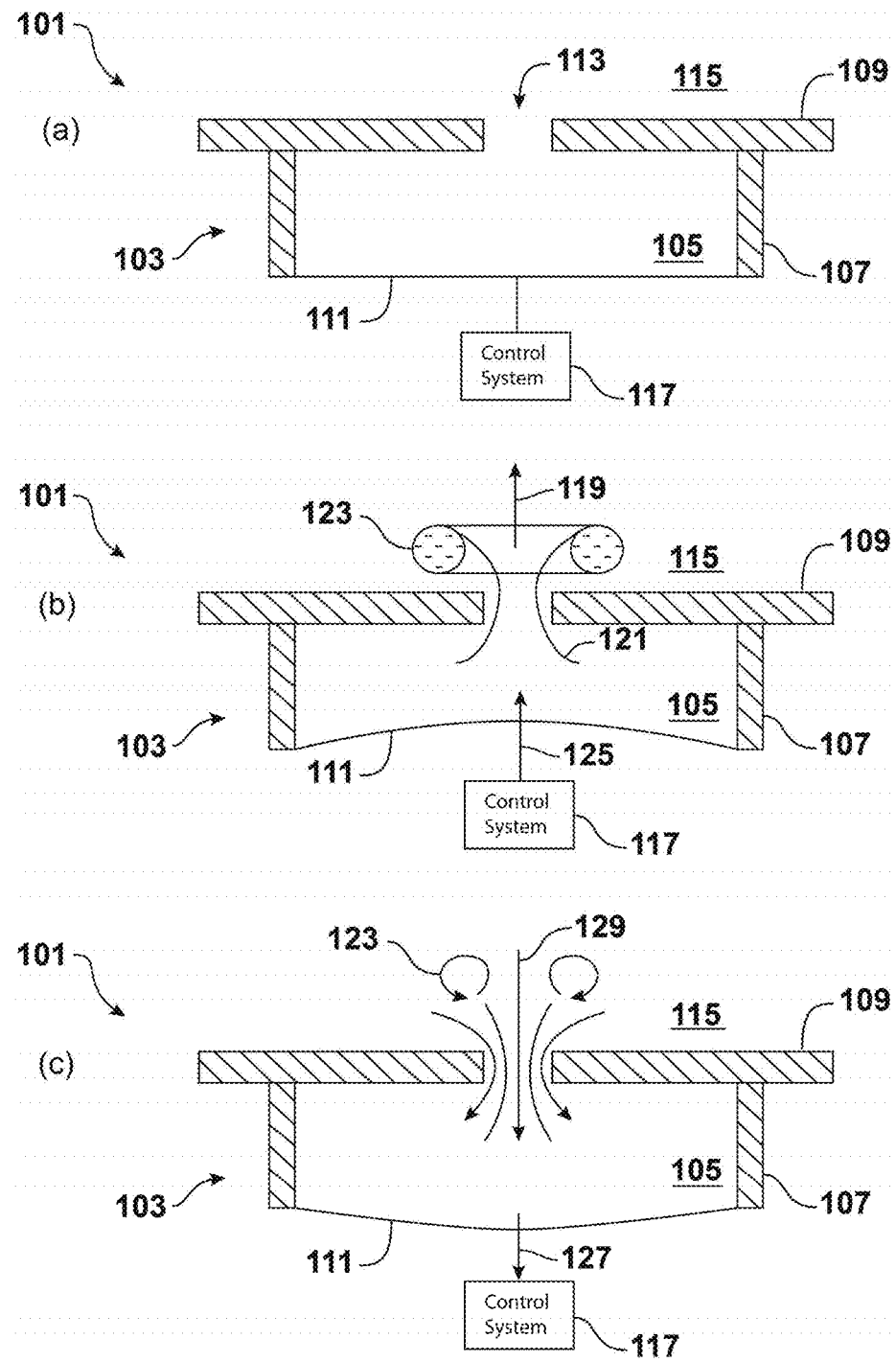
FIGS. 1A-1C are illustrations depicting the manner in which a synthetic jet actuator operates.

The structure of a synthetic jet ejector may be appreciated with respect to FIG. 1a. The synthetic jet ejector 101 depicted therein comprises a housing 103 which defines and encloses an internal chamber 105. The housing 103 and chamber 105 may take virtually any geometric configuration, but for purposes of discussion and understanding, the housing 103 is shown in cross-section in FIG. 1a to have a rigid side wall 107, a rigid front wall 109, and a rear diaphragm 111 that is flexible to an extent to permit movement of the diaphragm 111 inwardly and outwardly relative to the chamber 105. The front wall 109 has an orifice 113 therein which may be of various geometric shapes. The orifice 113 diametrically opposes the rear diaphragm 111 and fluidically connects the internal chamber 105 to an external environment having ambient fluid 115.

The movement of the flexible diaphragm 111 may be controlled by any suitable control system 117. For example, the diaphragm may be moved by a voice coil actuator. The diaphragm 111 may also be equipped with a metal layer, and a metal electrode may be disposed adjacent to, but spaced from, the metal layer so that the diaphragm 111 can be moved via an electrical bias imposed between the electrode and the metal layer. Moreover, the generation of the electrical bias can be controlled by any suitable device, for example but not limited to, a computer, logic processor, or signal generator. The control system 117 can cause the diaphragm 111 to move periodically or to modulate in time-harmonic motion, thus forcing fluid in and out of the orifice 113.

Alternatively, a piezoelectric actuator could be attached to the diaphragm 111. The control system would, in that case, cause the piezoelectric actuator to vibrate and thereby move the diaphragm 111 in time-harmonic motion. The method of causing the diaphragm 111 to modulate is not particularly limited to any particular means or structure.

The operation of the synthetic jet ejector 101 will now be described with reference to FIGS. 1b-FIG. 1c. FIG. 1b depicts the synthetic jet ejector 101 as the diaphragm 111 is controlled to move inward into the chamber 105, as depicted by arrow 125. The chamber 105 has its volume decreased and fluid is ejected through the orifice 113. As the fluid exits the chamber 105 through the orifice 113, the flow separates at the (preferably sharp) edges of the orifice 113 and creates vortex sheets 121. These vortex sheets 121 roll into vortices 123 and begin to move away from the edges of the orifice 109 in the direction indicated by arrow 119.

FIG. 1c depicts the synthetic jet ejector 101 as the diaphragm 111 is controlled to move outward with respect to the chamber 105, as depicted by arrow 127. The chamber 105 has its volume increased and ambient fluid 115 rushes into the chamber 105 as depicted by the set of arrows 129. The diaphragm 111 is controlled by the control system 117 so that, when the diaphragm 111 moves away from the chamber 105, the vortices 123 are already removed from the edges of the orifice 113 and thus are not affected by the ambient fluid 115 being drawn into the chamber 105. Meanwhile, a jet of ambient fluid 115 is synthesized by the vortices 123, thus creating strong entrainment of ambient fluid drawn from large distances away from the orifice 109.

Despite the many advances in synthetic jet ejector technology, a need for further advances in this technology still exists. For example, in some synthetic jet ejectors that are designed with a series of apertures that extend over the fins of a heat sink, the overhang interferes with entrainment of ambient fluid, thus reducing the efficiency of the device.

It has now been found that the foregoing issue may be remedied through the provision of entrainment features that enhance entrainment in synthetic jet ejectors where the structure of the device would otherwise interfere with or diminish entrainment. Such entrainment features may take several forms including, but not limited to, openings in the overhang, or the use of nozzle configurations in the form of spaced protrusions.

Figure 2:
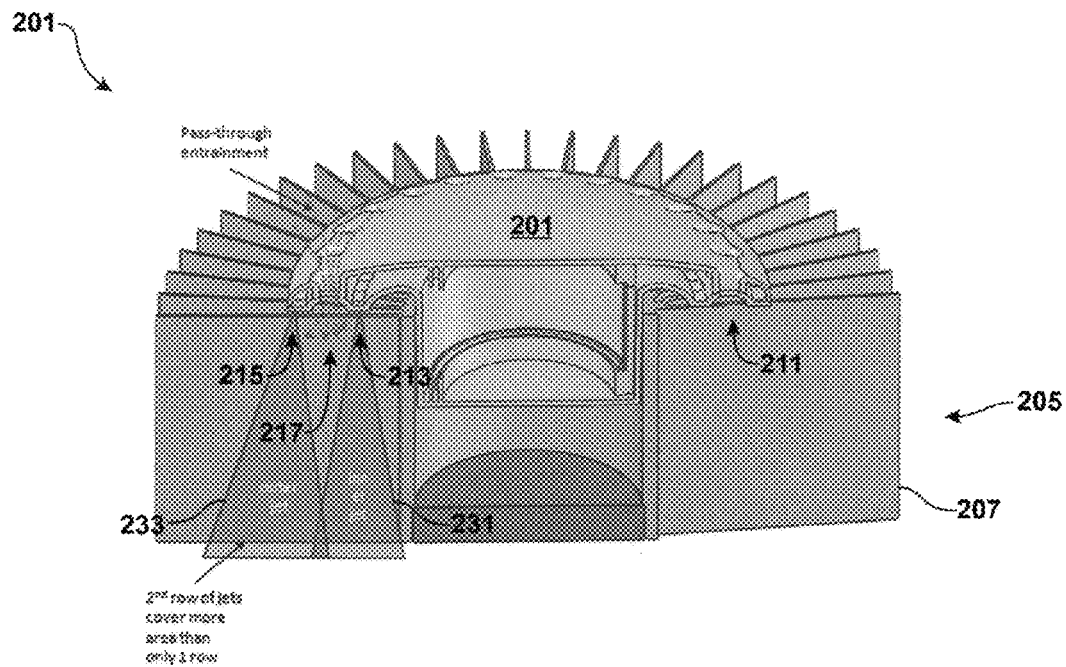
FIG. 2 is a cross-sectional view of a first embodiment of a synthetic jet ejector and heat sink assembly in accordance with the teachings herein.
Figure 3:
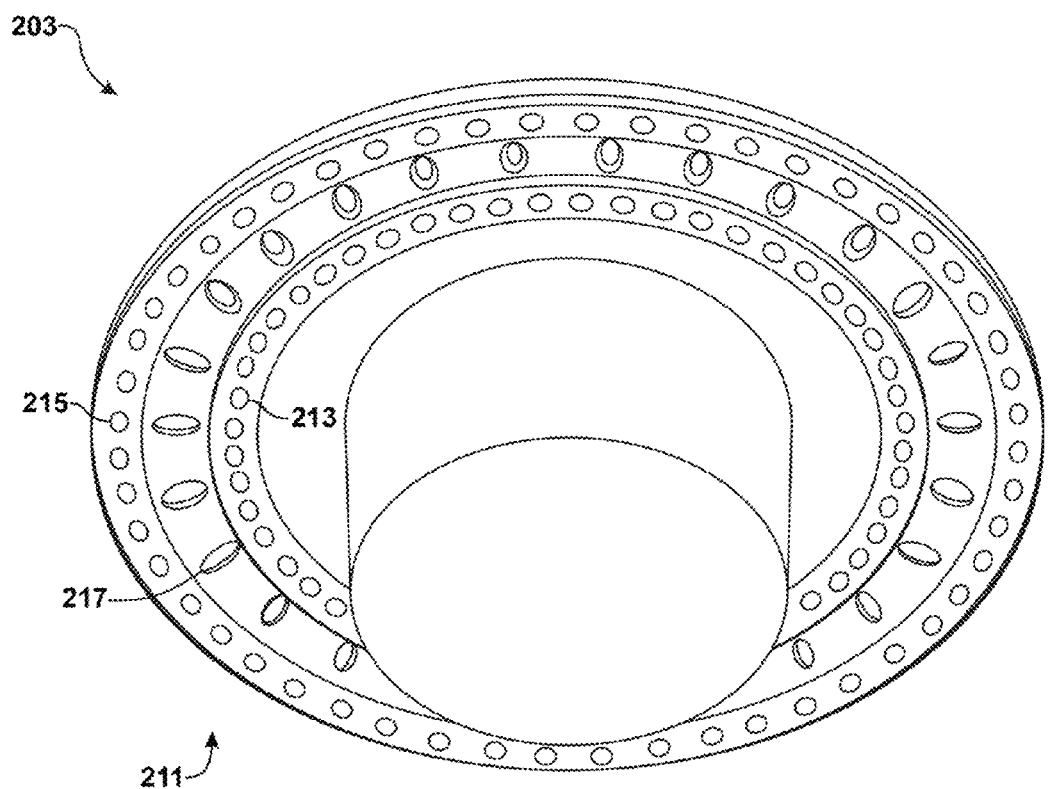
FIG. 3 is a bottom view of the synthetic jet ejector in the thermal management system of FIG. 2.
Figure 4:
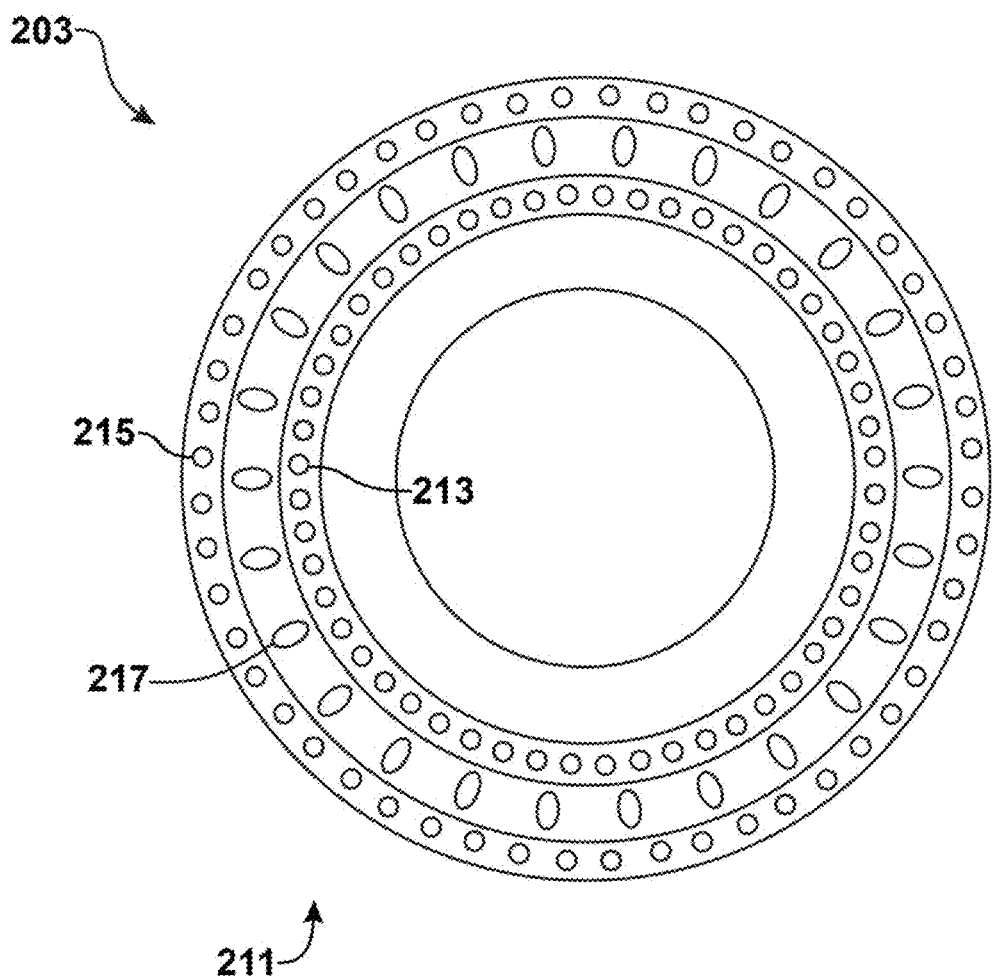
FIG. 4 is a perspective view of the synthetic jet ejector in the thermal management system of FIG. 2.
Figure 5:
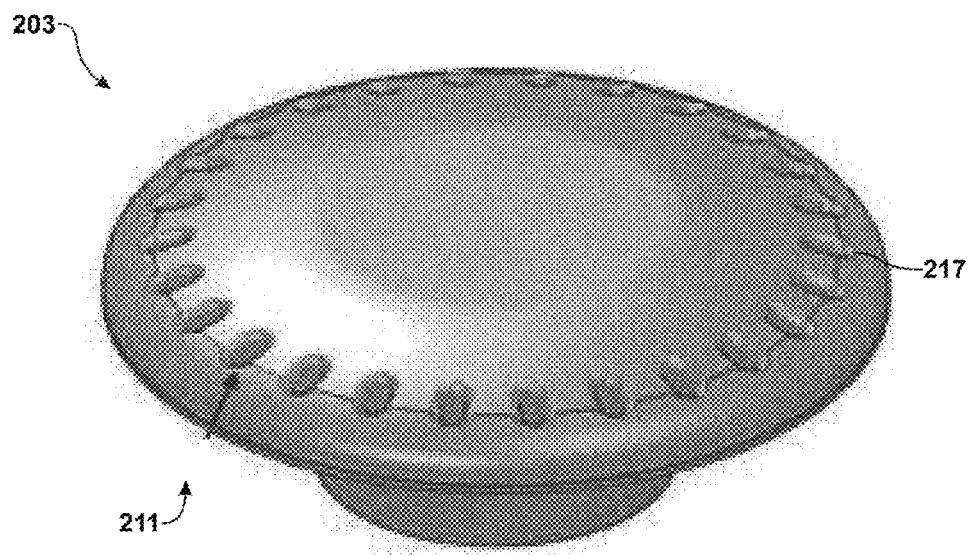
FIG. 5 is a perspective view of the synthetic jet ejector in the thermal management system of FIG. 2.
Figure 6:
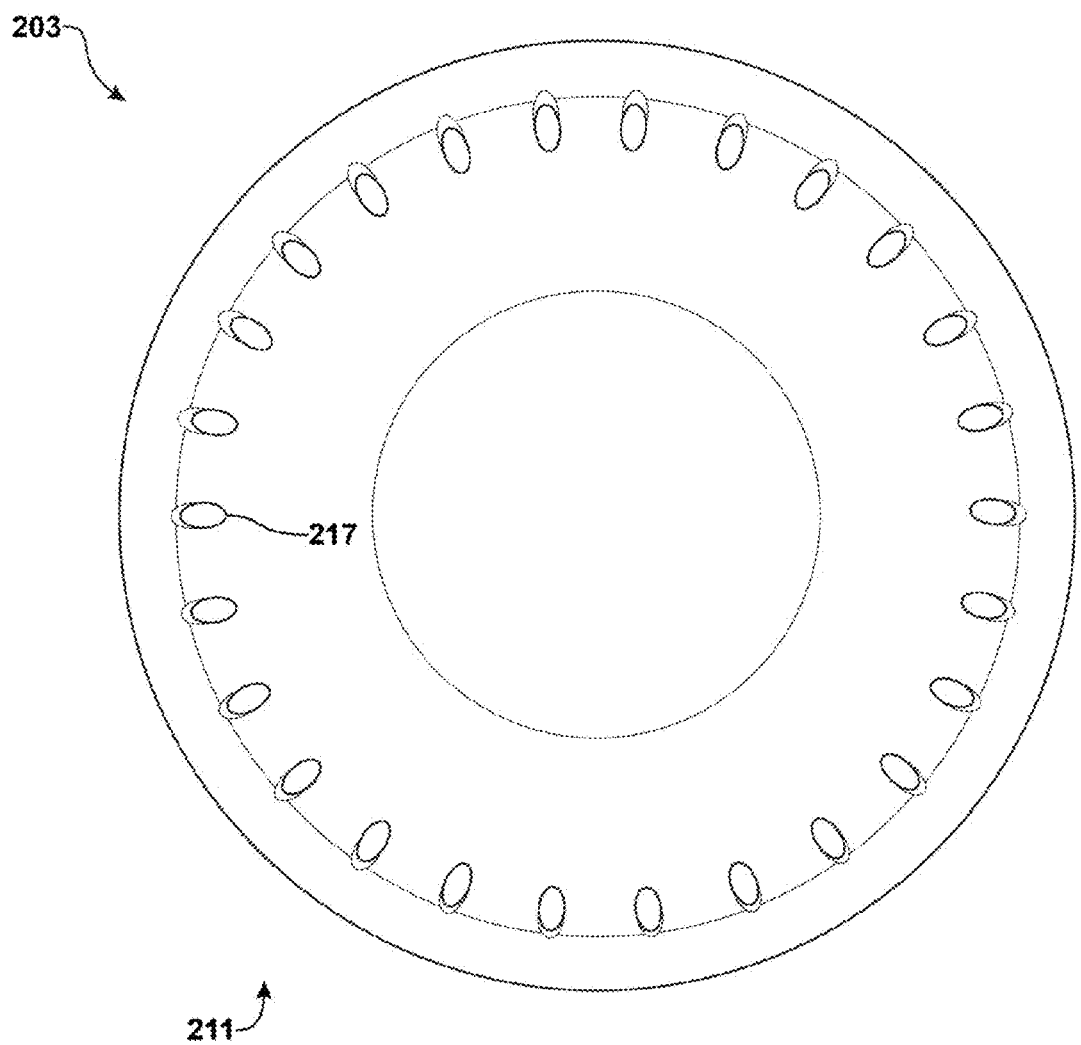
FIG. 6 is a top view of the synthetic jet ejector in the thermal management system of FIG. 2.

FIG. 2-6 illustrates a first particular, non-limiting embodiment of a thermal management system in accordance with the teachings herein. The thermal management system 201 depicted therein comprises a central synthetic jet ejector 203 (illustrated in further detail in FIGS. 3-6) around which is disposed a heat sink 205 comprising a plurality of heat fins 207. FIGS. 3 and 5 are perspective views, and FIGS. 4 and 6 are bottom and top views, respectively, of the synthetic jet ejector 203 of the thermal management system 201 of FIG. 2.

As seen in FIG. 2, the synthetic jet ejector 203 is equipped with a lip 211 which overhangs the heat sink 205. The lip 211 is equipped with a first set of apertures $S_1=\{a_1, \ldots, a_i\}$ 213, a second set of apertures $S_2=\{b_1, \ldots, b_j\}$ 215 and a set of entrainment features $S_3=\{c_1, \ldots, c_k\}$ 217, wherein i, j, k≥1, and wherein, for any pair of adjacent apertures $P_a=\{a_m, b_n\}$ 213, 215, wherein $a_m \in S_1$ and m ∈I=$\{1, \ldots, i\}$, and wherein $b_n \in S_2$ and n ∈ J=$\{1, \ldots, j\}$, there is at least one entrainment feature $c_p \in S_3$ 217 which is disposed between aperture $a_m$ 213 and aperture $b_n$ 215, wherein p ∈ K=$\{1, \ldots, k\}$.

The synthetic jet ejector 203 includes a synthetic jet actuator disposed in the housing 209 which is in fluidic communication with the sets of apertures $S_1$ and $S_2$ and which operates to create a synthetic jet at each aperture $d_r$ ∈ $\{S_1, S_2\}$, wherein r ∈ I∪J. The synthetic jet actuator has been omitted from the drawings for the purpose of clarity, but is preferably of the type disclosed in U.S. Pat. No. 7,768,779 (Heffington et al.), which is incorporated herein by reference in its entirety (see, e.g., FIGS. 28-31 thereof), or in U.S. Pat. No. 8,066,410 (Boothe et al.), which is also incorporated herein by reference in its entirety (see, e.g., FIGS. 4-6 and 12-14 thereof). The heat sink 205 is equipped with a plurality of fins 207 and is positioned with respect to said synthetic jet actuator 219 such that the synthetic jet created at each aperture $d_r$ is directed between an adjacent pair of said fins 207.

As seen in FIG. 2, the synthetic jet ejector 203 in this particular embodiment creates first 231 and second 233 sets of synthetic jets at respective apertures $S_1$ and $S_2$. Each of the members of the first 231 and second 233 sets of synthetic jets is separated by an entrainment feature 217 which, in the particular embodiment depicted, is a passageway which extends through the lip 211. While the synthetic jet ejector 203 is in operation, fluid is drawn through the entrainment features 217 and entrained by the adjacent synthetic jets, thus facilitating thermal management.

Figure 7:
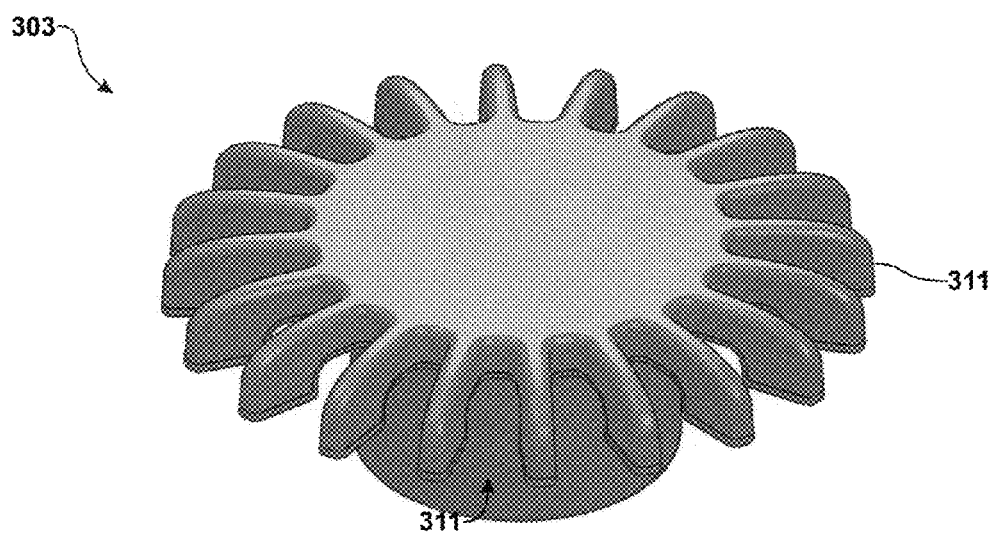
FIG. 7 is a perspective view of a second embodiment of a synthetic jet ejector in accordance with the teachings herein.
Figure 8:
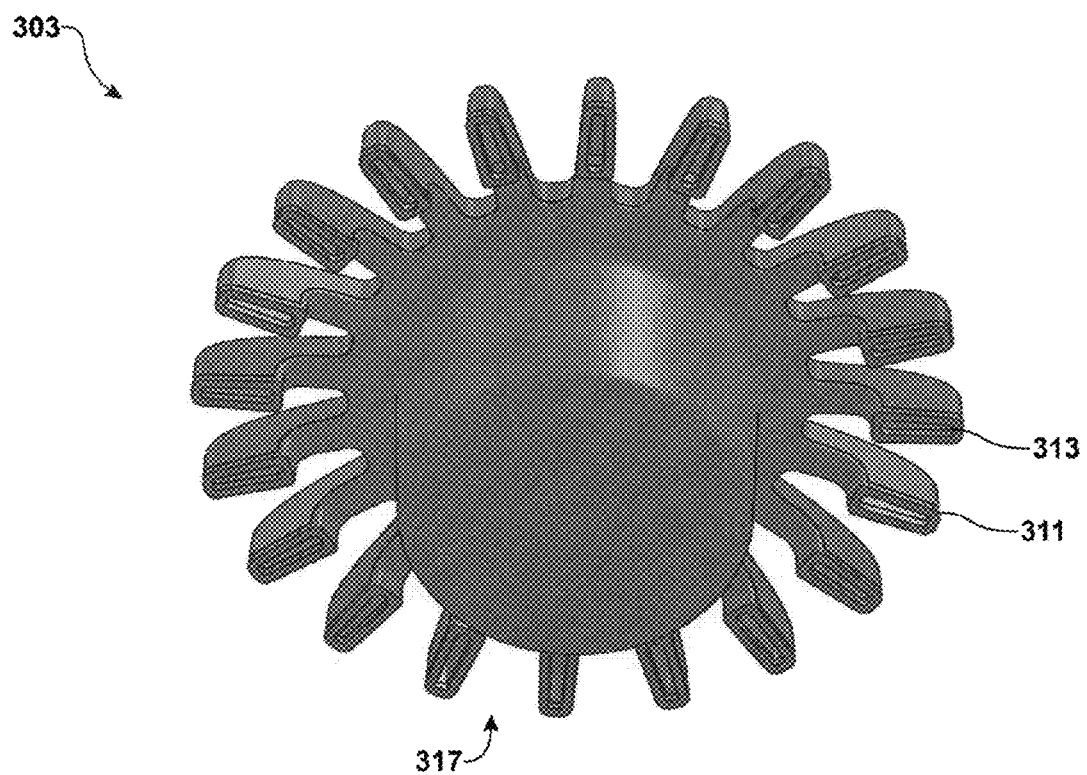
FIG. 8 is another perspective view of the embodiment of FIG. 7.

FIGS. 7-8 illustrate a second particular, non-limiting embodiment of a synthetic jet ejector 303 in accordance with the teachings herein, and which may be utilized in the thermal management system of FIGS. 2-6. The synthetic jet ejector 303 in this embodiment differs from the synthetic jet ejector 203 depicted in FIGS. 2-6 in that the lip 311 in this embodiment comprises a series of protrusions or "petals" from which the synthetic jets are ejected, and the entrainment features 217 are spaces between the protrusions 311. While only a single aperture 313 is depicted in each protrusion 311, it will be appreciated that, in some embodiments, each protrusion 313 may contain two or more apertures. Similarly, in some embodiments, one or more flow control features may be provided at the entrance to the space between adjacent heat fins to split a synthetic jet into two or more sub-jets.

It will be appreciated that the devices and methodologies disclosed herein may be utilized to thermally manage a variety of heat sources. Such heat sources may include, for example, semiconductor devices or die, LED light sources, PCBs, or the like. In some embodiments, the heat source may be a heat pipe or other device which transfers heat from another heat source.

The heat source is typically placed so that it is in thermal contact with the thermal management system. In some embodiments, the heat source may be mounted on an internal or external surface of the housing of the thermal management system. In other embodiments, the heat source may be spaced apart from the thermal management system but may be in thermal contact with it via a heat pipe or by other suitable means.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A thermal management system, comprising:
a housing equipped with a first set of apertures $S_1=\{a_1, \ldots, a_i\}$, a second set of apertures $S_2=\{b_1, \ldots, b_j\}$ and a set of entrainment features $S_3=\{c_1, \ldots, c_k\}$, wherein i, j, k≥1, and wherein, for any pair of adjacent apertures $P_a=\{a_m, b_n\}$, wherein $a_m \in S_1$ and $m \in I=\{1, \ldots, i\}$, and wherein $b_n \in S_2$ and $n \in J=\{1, \ldots, j\}$, there is at least one entrainment feature $c_p \in S_3$ which is disposed between aperture $a_m$ and aperture $b_n$, wherein $p \in K=\{1, \ldots, k\}$; and
a synthetic jet actuator disposed in said housing which is in fluidic communication with the sets of apertures $S_1$ and $S_2$ and which operates to create a synthetic jet at each aperture $d_r \in \{S_1, S_2\}$, wherein $r \in I \cup J$.

2. The thermal management system of claim 1, further comprising:
a heat sink equipped with a plurality of fins and positioned with respect to said synthetic jet actuator such that the synthetic jet created at each aperture $d_r$ is directed between an adjacent pair of said fins.

3. The thermal management system of claim 2, wherein the housing comprises a lip which extends over said heat sink, and wherein the entrainment features are a series of passageways which extend through said lip.

4. The thermal management system of claim 2, wherein the housing comprises a series of protrusions which extends over said heat sink, wherein the first and second sets of apertures are disposed in said series of protrusions, and wherein the entrainment features are a series of spaces between said protrusions.

5. The thermal management system of claim 1, wherein a heat source is disposed on an external surface of said housing.

6. The thermal management system of claim 1, wherein a heat source is disposed on an internal surface of said housing.

7. The thermal management system of claim 6, wherein said heat source is a semiconductor chip.

8. The thermal management system of claim 1, further comprising first and second heat sources associated with said housing, and wherein said first heat source is a heat pipe which is in thermal communication with a second heat source.

9. The thermal management system of claim 1, wherein said thermal management system further comprises a heat sink which is equipped with a plurality of heat fins.

10. The thermal management system of claim 9, wherein said first and second sets of apertures comprise a plurality of pairs of spaced apart apertures, and wherein each aperture in any of said pairs of spaced apart apertures directs a synthetic jet into a same space formed by a pair of adjacent heat fins.

11. A method for cooling a heat source, comprising:
providing a thermal management system comprising (a) a housing equipped with a first set of apertures $S_1=\{a_1, \ldots, a_i\}$, a second set of apertures $S_2=\{b_1, \ldots, b_j\}$ and a set of entrainment features $S_3=\{c_1, \ldots, c_k\}$, wherein i, j, k≥1, and wherein, for any pair of adjacent apertures $P_a=\{a_m, b_n\}$, wherein $a_m \in S_1$ and $m \in I=\{1, \ldots, i\}$, and wherein $b_n \in S_2$ and $n \in J=\{1, \ldots, j\}$, there is at least one entrainment feature $c_p \in S_3$ which is disposed between aperture $a_m$ and aperture $b_n$, wherein $p \in K=\{1, \ldots, k\}$, and (b) a synthetic jet actuator disposed in said housing which is in fluidic communication with the sets of apertures $S_1$ and $S_2$ and which operates to create a synthetic jet at each aperture $d_r \in \{S_1, S_2\}$, wherein $r \in I \cup J$;
disposing a heat source on a surface of said housing; and
operating said synthetic jet actuator so as to create a synthetic jet at each aperture $d_r \in \{S_1, S_2\}$, wherein $r \in I \cup J$.

12. The method of claim 11, wherein operating the synthetic jet actuator entrains ambient fluid at each member of the set of entrainment features $S_3$.

13. The method of claim 11, wherein said heat source is disposed on an external surface of said housing.

14. The method of claim 11, wherein said heat source is disposed on an internal surface of said housing.

15. The method of claim 11, wherein said heat source is a semiconductor chip.

16. The method of claim 11, wherein said heat source comprises first and second heat sources, and wherein said first heat source is a heat pipe which is in thermal communication with a second heat source.

17. The method of claim 11, wherein said thermal management system further comprises a heat sink.

18. The method of claim 17, wherein said heat sink comprises a plurality of heat fins.

19. The method of claim 18, wherein said first and second sets of apertures comprise a plurality of pairs of spaced apart apertures, and wherein each aperture in any of said pairs of spaced apart apertures directs a synthetic jet into a same space formed by a pair of adjacent heat fins.

20. The method of claim 19, wherein each of said plurality of heat fins has a planar surface, and wherein each aperture directs a synthetic jet along an axis that is parallel to the planar surface of one of said heat fins.

* * * * *